(12) United States Patent
Kelly et al.

(10) Patent No.: US 7,895,026 B1
(45) Date of Patent: Feb. 22, 2011

(54) MULTI-RATE SIMULATION SCHEDULER FOR SYNCHRONOUS DIGITAL CIRCUITS IN A HIGH LEVEL MODELING SYSTEM

(75) Inventors: Sean A. Kelly, Boulder, CO (US); Stephen A. Neuendorffer, San Jose, CA (US); Haibing Ma, Superior, CO (US)

(73) Assignee: Xilinx, Inc., San Jose, CA (US)

( * ) Notice: Subject to any disclaimer, the term of this patent is extended or adjusted under 35 U.S.C. 154(b) by 859 days.

(21) Appl. No.: 11/893,570

(22) Filed: Aug. 16, 2007

(51) Int. Cl.
G06F 17/50 (2006.01)
G06F 9/455 (2006.01)
G06F 1/00 (2006.01)

(52) U.S. Cl. ............... 703/14; 703/13; 703/15; 703/16; 703/17; 703/23; 716/2; 716/4; 716/6; 716/7; 716/18; 713/500

(58) Field of Classification Search ............ 703/14, 703/13, 15, 16, 17, 23; 716/2, 4, 6, 7, 18; 713/500
See application file for complete search history.

(56) References Cited

U.S. PATENT DOCUMENTS

| 5,550,760 | A * | 8/1996 | Razdan et al. ............. 703/14 |
| 5,649,167 | A * | 7/1997 | Chen et al. ............... 703/23 |
| 5,784,593 | A * | 7/1998 | Tseng et al. .............. 703/15 |
| 5,809,283 | A * | 9/1998 | Vaidyanathan et al. ....... 703/16 |
| 5,862,361 | A * | 1/1999 | Jain ..................... 703/16 |
| 5,978,571 | A * | 11/1999 | Grundmann ............... 703/23 |
| 6,026,230 | A * | 2/2000 | Lin et al. ................ 703/13 |
| 6,173,435 | B1 * | 1/2001 | Dupenloup ............... 716/18 |
| 6,523,155 | B1 * | 2/2003 | Ruedinger ............... 716/7 |
| 6,785,873 | B1 * | 8/2004 | Tseng ................... 716/4 |
| 7,000,137 | B2 * | 2/2006 | Sivaraman et al. ......... 713/500 |
| 7,039,887 | B2 * | 5/2006 | Khalil et al. ............ 716/5 |
| 7,143,377 | B1 * | 11/2006 | Kudlugi et al. .......... 716/6 |
| 7,412,678 | B2 * | 8/2008 | Lahner et al. ........... 716/6 |
| 7,483,825 | B2 * | 1/2009 | Van Huben et al. ........ 703/16 |
| 2003/0065964 | A1 * | 4/2003 | Parikh .................. 713/500 |
| 2007/0078639 | A1 * | 4/2007 | Rich et al. ............. 703/17 |
| 2007/0129923 | A1 * | 6/2007 | Langer et al. ........... 703/13 |
| 2007/0288874 | A1 * | 12/2007 | Czeck et al. ............ 716/6 |

OTHER PUBLICATIONS

DeVane, Charles. "Efficient Circuit Partitioning to Extend Cycle Simulation Beyond Synchronous Circuits", IEEE 1997.*
Cadence: "Clock Doman Crossing: Closing the Loop on Clock Domain Functional Implementation Problems", Cadence 2004.*
Iyer et al. "Power and Performance of Globally Asynchronous Locally Synchronous Processors", IEEE 2002.*
Bertacco et al. "Cycle-Based Simulation of Gate-Level Synchronous Circuits", ACM 1999.*

* cited by examiner

Primary Examiner—Kamini S Shah
Assistant Examiner—Shambhavi Patel
(74) Attorney, Agent, or Firm—Kevin T. Cuenot; Lois D. Cartier (57) ABSTRACT

A computer-implemented method of scheduling a multi-rate, synchronous circuit design for simulation within a high-level modeling system. The method can include determining a component clocking rate for each of a plurality of synchronous components of the circuit design and classifying each of the plurality of synchronous components into a plurality of schedules according to component clocking rate. For each clock cycle during simulation, the method can include selecting one of the plurality of schedules and executing each synchronous component of the selected schedule. A value determined through execution of a synchronous component of the circuit design can be output.

20 Claims, 4 Drawing Sheets

| Simulation Clock Cycle | Schedule 1 [(Clock cycle) mod 2] | Schedule 2 [(Clock cycle) mod 5] | Schedule 3 [(Clock cycle) mod 10] | Selected Group |
|---|---|---|---|---|
| 1 | 1 | 1 | 1 | None |
| 2 | 0 | 2 | 2 | 1 |
| 3 | 1 | 3 | 3 | None |
| 4 | 0 | 4 | 4 | 1 |
| 5 | 1 | 0 | 5 | 2 |
| 6 | 0 | 1 | 6 | 1 |
| 7 | 1 | 2 | 7 | None |
| 8 | 0 | 3 | 8 | 1 |
| 9 | 1 | 4 | 9 | None |
| 10 | 0 | 0 | 0 | 3 |

FIG. 5

MULTI-RATE SIMULATION SCHEDULER FOR SYNCHRONOUS DIGITAL CIRCUITS IN A HIGH LEVEL MODELING SYSTEM

FIELD OF THE INVENTION

The embodiments disclosed herein relate to simulating synchronous, digital circuits and, more particularly, to scheduling such circuits for simulation.

BACKGROUND

Electronic circuit designs can be constructed, simulated, debugged, and translated into electronic hardware using a High Level Modeling System (HLMS). Typically, an HLMS is implemented as a software-based design tool. The HLMS provides blocks that can be combined to build an electronic circuit. A block refers to a high level software construct that represents a particular circuit function, such as multiplexing, addition, multiplication, or the like, e.g., a component. Blocks may have ports that can produce and consume signals, and may be arranged within the HLMS to form a circuit and/or system. Communication among the blocks can be represented by wires, or signals, that graphically link the blocks.

The circuit design may be simulated within the HLMS once it is constructed. Some HLMS tools further can generate a hardware implementation from the block representation of the circuit design. For example, an HLMS may generate the bitstream necessary to program a field programmable gate array (FPGA) or can generate the hardware description language (HDL) files necessary to specify the hardware design. One example of an HLMS is System Generator for DSP™ (System Generator) available from Xilinx, Inc. of San Jose, Calif. System Generator is a system level modeling tool that facilitates FPGA hardware design. System Generator provides cycle accurate and bit accurate simulation of circuit designs to be implemented within an FPGA.

Simulating a circuit design entails determining an execution order for the various blocks of the circuit design and executing each of the blocks according to that order. Typically, the circuit design to be simulated is represented as a directed graph in which vertices represent blocks, or circuit components, and arcs represent ports, or signals. To simulate a circuit design in a bit and cycle accurate manner, the blocks forming the circuit design must be executed in an order that reflects dependencies among the blocks as represented by the directed graph. The input of a given block, for example, may be affected by the outputs of one or more other blocks. A conventional HLMS typically visits each block of the circuit design on each clock cycle of the simulation. On each clock cycle of the simulation, a determination is made as to whether each block is to be executed when visited. Within a multi-rate, synchronous circuit design, not all blocks may execute on each clock cycle. With respect to multi-rate, synchronous circuit designs, this manner of scheduling can be inefficient and resource intensive.

SUMMARY

The embodiments disclosed herein relate to simulating multi-rate, synchronous digital circuits and, more particularly, to scheduling such circuits during simulation. One embodiment of the present invention can include a computer-implemented method of scheduling a multi-rate, synchronous, circuit design for simulation within a high level modeling system. The method can include determining a component clocking rate for each of a plurality of synchronous components of the circuit design and classifying each of the plurality of synchronous components into a plurality of schedules according to the component clocking rate. For each clock cycle during the simulation, the method can include selecting one of the plurality of schedules and executing each synchronous component of the selected schedule. A value determined through the execution of a synchronous component of the circuit design can be output.

The computer-implemented method further can include, for each schedule including a single clocking rate, setting a schedule clocking rate for the schedule to the single clocking rate. For each schedule including more than one component clocking rate, a schedule clocking rate for the schedule is set to a least common multiple of each component clocking rate of the schedule.

For each clock cycle during simulation, selecting a schedule can include, for each schedule, calculating a modulus function of the clock cycle and the schedule clocking rate and selecting the schedule according to a result obtained from the modulus function calculation for each schedule. Selecting a schedule also can include, of the schedules having a zero result from the modulus function, selecting the schedule having the largest schedule clocking rate.

Executing can include selecting a schedule according to a modulus function depending upon the current clock cycle of the simulation. Classifying can include determining a number of different component clocking rates, denoted as "n," of the circuit design and assigning each component into different ones of a plurality of schedules. The plurality of schedules can be equal to $2^n-1$.

In one embodiment, determining a component clocking rate and classifying each of the plurality of synchronous components can occur prior to a start of simulation of the circuit design. The computer-implemented method also can include locating a pointer to a simulation function for at least one synchronous component of the circuit design, storing the pointer in a data structure, and calling the simulation function via the pointer during simulation to execute the at least one synchronous component.

In another embodiment, the circuit design can be represented as a directed graph. In that case, the computer-implemented method can include identifying a selected component of the circuit design that receives input signals from a node within a first sub-graph and a node within a second sub-graph, and executing the selected component responsive to the node of the first sub-graph and the node of the second sub-graph both being updated.

Another embodiment of the present invention can include a computer-implemented method of scheduling a multi-rate, synchronous circuit design for simulation within a high-level modeling system. The computer-implemented method can include, prior to simulation, determining a component clocking rate for each of a plurality of synchronous components of the circuit design. Prior to simulation, each of the plurality of synchronous components can be classified into a plurality of schedules according to component clocking rate.

Each schedule can have a schedule clocking rate determined according to component clocking rates of the schedule. For each clock cycle during simulation, the method can include, for each schedule, calculating a modulus function of the clock cycle and the schedule clocking rate, selecting one of the plurality of schedules according to a result obtained from the modulus function calculation for each schedule, and executing each synchronous component of the selected schedule. The method further can include outputting a value determined through execution of a synchronous component of the circuit design.

The computer-implemented method also can include, for each schedule including a single clocking rate, setting a schedule clocking rate for the schedule to the single clocking rate and, for each schedule including more than one component clocking rate, setting a schedule clocking rate for the schedule to a least common multiple of each component clocking rate of the schedule.

The computer-implemented method can include flattening a call stack for at least one update function for a synchronous component of the circuit design. The computer-implemented method also can include identifying a selected component of the circuit design that receives input signals from a node of a first sub-graph and a node of a second sub-graph. The selected component can be executed responsive to the node of the first sub-graph and the node of the second sub-graph both being updated.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The embodiments disclosed herein relate to simulating synchronous, digital circuits. Components of a multi-rate, synchronous, digital circuit design can be characterized in terms of clocking rate. The phrase "clocking rate," as used herein, can refer to the particular clock cycles on which a given component will execute or become active. Typically, the clocking rate of a component can be specified in terms of an integer multiple of the clock frequency of the circuit design. A circuit design in which two or more different clocking rates exist for components can be said to be "multi-rate."

Synchronous components of a circuit design can be classified, or assigned, to particular schedules such that each component within a schedule has a same or related clocking rate. When simulation of the circuit design begins, rather than examining each component of the circuit design on each clock cycle of the simulation to determine which component will execute, a particular schedule can be selected according to the current clock cycle of the simulation. The schedule can be selected according to a schedule clocking rate that is determined and assigned to each schedule. The components of the selected schedule can be executed as part of the simulation. That is, the update function, or function that simulates behavior of the component of the circuit design can be executed. Scheduling the circuit design in this manner can conserve computing resources as each component of the circuit design is not visited on each clock cycle of the simulation. Further aspects of the embodiments disclosed herein will be discussed in greater detail with reference to the figures.

Figure 1:
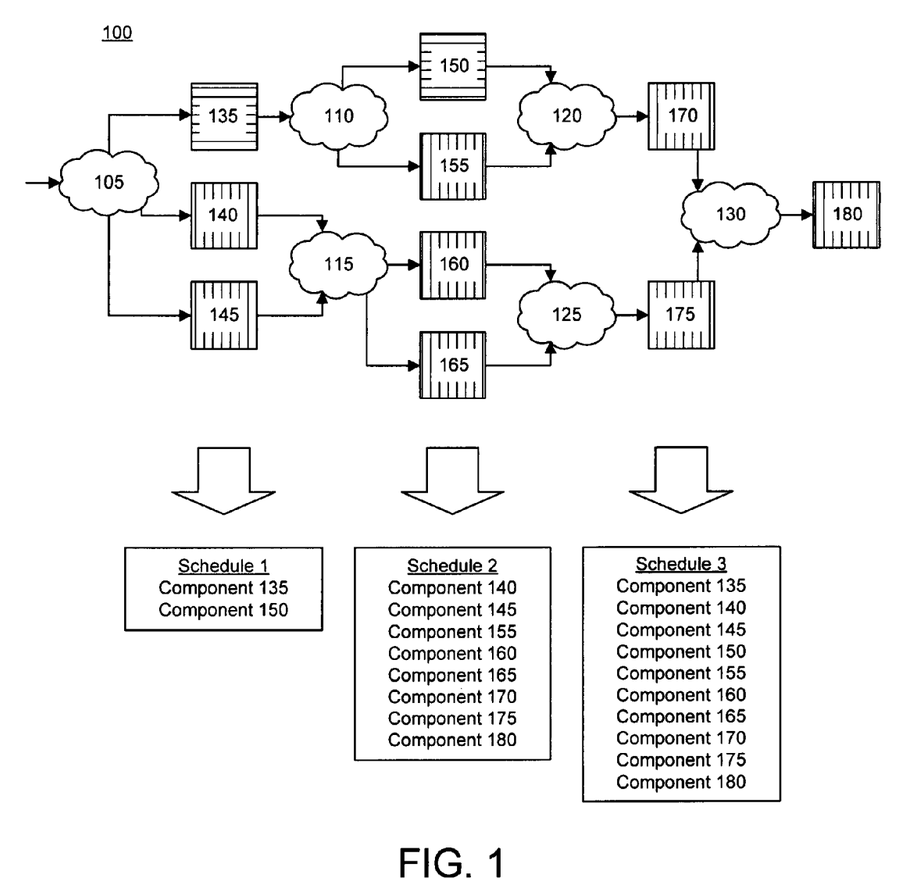
FIG. 1 is a block diagram illustrating a circuit design in accordance with one embodiment of the present invention.

FIG. 1 is a block diagram illustrating a circuit design 100 in accordance with one embodiment of the present invention. The circuit design 100 can be a programmatic description of a digital, synchronous circuit. The graphical depiction of circuit design 100 is presented for purposes of illustration only. As such, FIG. 1 is not intended to limit the embodiments disclosed herein to a particular architecture or number of components. For example, circuit design 100 may be larger or smaller than illustrated in FIG. 1, without limitation.

The circuit design 100 can be loaded into, or specified within, a High Level Modeling System (HLMS). In one embodiment, the circuit design 100 can be one that is to be implemented within a programmable logic device (PLD) such as a field programmable gate array (FPGA), though the embodiments are not limited to such a configuration. The circuit design 100 can be simulated by the HLMS in a bit and cycle accurate manner. It should be appreciated that while the circuit design 100 is described as hardware, e.g., referring to synchronous components and combinatorial logic, the circuit design 100, for purposes of design and/or simulation, is represented in programmatic form. Thus, a component can be represented by a programmatic construct, e.g., computer-usable program code, which can be executed to model or mimic the actual physical component represented by the programmatic construct.

As shown, the circuit design 100 can include a plurality of synchronous components 135, 140, 145, 150, 155, 160, 165, 170, 175, and 180. The synchronous components 135-180 are clocked and, as such, do not operate upon received input signals until a clock signal is received by the component which activates or stimulates operation of the component. The circuit design 100 further can include a plurality of combinatorial logic structures 105, 110, 115, 120, 125, and 130. The combinatorial logic structures 105-130 are not clocked and, from the viewpoint of simulation, process input signals immediately upon receipt. That is, when an input signal is received, an output signal is considered to be immediately available at the output of the combinatorial logic structure.

A multi-rate, digital, synchronous circuit design, such as circuit design 100, may include synchronous components that execute at different multiples of the clock frequency of the circuit. During simulation, clock cycles can be normalized such that time can be represented in terms of number of clock cycles, rather than in terms of frequency. For example, a simulation time of one can indicate the first clock cycle of a simulation. A simulation time of five can indicate the fifth clock cycle of a simulation, and so on.

As noted, a clocking rate effectively indicates a particular multiple of the simulation time, in terms of clock cycles, that a synchronous component or group of synchronous components will execute. For purposes of illustration, components 135 and 150 can have a clocking rate of two. That is, component 135 and component 150 will execute on each clock cycle of a simulation that is a multiple of two, e.g., two, four, six, etc. Components 140, 145, and 155-180 can have a clocking rate of five. A clocking rate of five indicates that each of components 140, 145, and 155-180 will execute on every clock cycle that is a multiple of five, e.g., 5, 10, 15, etc. The circuit design 100 can be said to have a schedule including two different clocking rates. For example, the schedule of circuit design 100 can be specified as [2,5] in reference to the synchronous components having a clocking rate of two and the synchronous components having a clocking rate of five.

In accordance with the embodiments disclosed herein, the synchronous components of the circuit design 100 can be classified into a plurality of schedules. The primary schedule of the circuit design, which reflects each component clocking rate in circuit design 100, e.g., clocking rates [2,5], can be divided into $2^n-1$ schedules where "n" is equal to the number of clocking rates of the primary schedule. Within circuit design 100, n=2. The synchronous components can be assigned to various ones of the schedules. Forming $2^n-1$ schedules effectively results in all possible combinations of clocking rates of the primary schedule. For example, with regard to circuit design 100, the primary schedule can be divided into $2^n-1=3$ schedules.

The resulting schedules can be denoted as schedule 1, schedule 2, and schedule 3. Having determined the various schedule "permutations" or classes, a clocking rate for each schedule, denoted as a schedule clocking rate, can be determined for each schedule. Schedule 1 can include synchronous components having a clocking rate of two, e.g., synchronous components 135 and 150. Since schedule 1 includes only synchronous components having a clocking rate of two, e.g., member components having a single or same clocking rate, the schedule clocking rate of schedule 1 can be set equal to two. Similarly, schedule 2 can include only synchronous components having a clocking rate of five, e.g., components 140, 145, and 155-180. Since schedule 2 includes only components having a clocking rate of five, the schedule clocking rate of schedule 2 can be set equal to five.

Schedule 3 includes synchronous components having a clocking rate of two and synchronous components having a clocking rate of five. In this example, schedule 3 will include all synchronous components 135-180. In cases where the schedule has components of two or more different clocking rates, the schedule clocking rate of the schedule can be determined to be the least common multiple of the clocking rates contained therein. In this case, as schedule 3 includes synchronous components having clocking rates of two and five, the schedule clocking rate of schedule 3 will be the least common multiple of two and five which is 10.

As all combinations of clocking rates are generated, a component will be assigned to each schedule that includes the clocking rate of that particular component. Thus, a component will be assigned to more than one schedule. In illustration, component 135 is included in schedule 1 and schedule 3 since both schedule 1 and schedule 3 include components having clocking rates of two.

Figure 2:
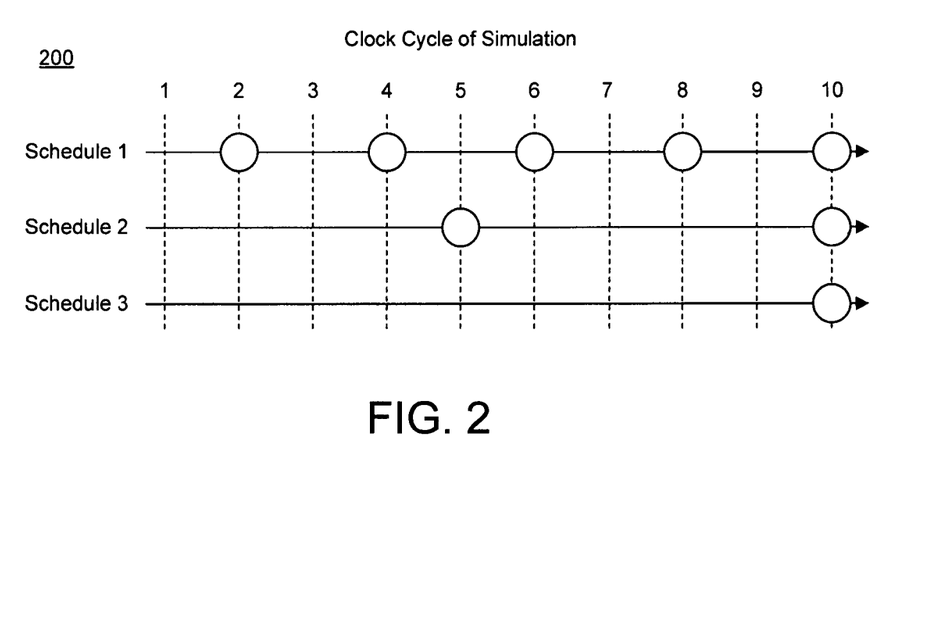
FIG. 2 is a timing graph illustrating scheduling of the circuit design of FIG. 1 in accordance with another embodiment of the present invention.

FIG. 2 is a timing graph 200 illustrating scheduling of the circuit design of FIG. 1 in accordance with another embodiment of the present invention. FIG. 2 illustrates the execution times of schedules 1, 2, and 3 for the circuit design pictured in FIG. 1. Timing graph 200 depicts a timeline for simulation of the circuit design of FIG. 1 beginning at clock cycle 1 and continuing through clock cycle 10. Circles located at intersection points for the schedules and clock cycles indicate that the components of the corresponding schedule are to be executed on the specified, or intersecting, clock cycle. For example, the timing graph 200 indicates that each component of schedule 1 is to be executed on clock cycles 2, 4, 6, 8, and 10. Each component of schedule 2 is to be executed at clock cycles 5 and 10. Each component of schedule 3 is to be executed at clock cycle 10.

Figure 3:
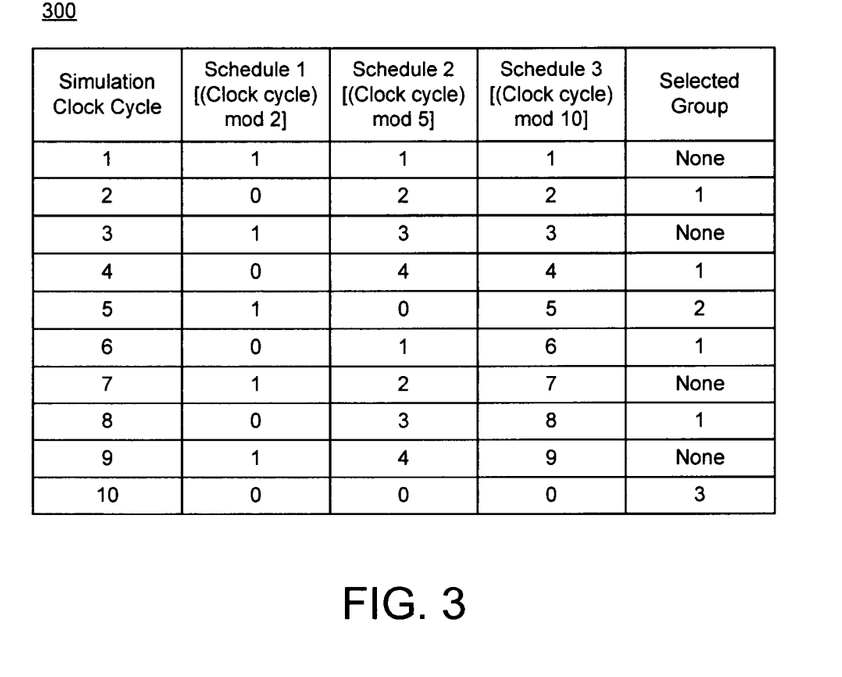
FIG. 3 is a table illustrating scheduling of the circuit design of FIG. 1 in accordance with another embodiment of the present invention.

FIG. 3 is a table 300 illustrating scheduling of the circuit design of FIG. 1 in accordance with another embodiment of the present invention. Table 300 illustrates how a schedule can be selected at different simulation times. Table 300 shows that the current simulation time can be used, in combination with the clocking rate of each schedule, to determine which schedule is to be selected at a give simulation time, e.g., a particular clock cycle of the simulation.

At each clock cycle of the simulation, the current time can be used in a modulus calculation with the schedule clocking rate of each schedule. At each clock cycle during simulation, the following calculation can be performed for each schedule: [(current clock cycle of simulation) mod (schedule clocking rate)]. The results for clock cycles 1-10 are shown in table 300. After calculating the results for the various schedules, the schedule having a zero result with the highest clocking rate can be selected. Each of the synchronous components of the selected schedule can be executed. As noted, the simulation function that mimics the behavior of the hardware component can be executed for each synchronous component of the selected schedule.

At clock cycle one of the simulation, for example, the current simulation time, e.g., one, can be divided by the clocking rate of each schedule. The result of each operation is shown in table 300. Each modulus operation yields a nonzero result. Accordingly, for time 1, no schedule is selected. Correspondingly, no synchronous components are executed.

At clock cycle 2, the calculation (2 mod 2) for schedule 1 results in a value of 0. The other calculations relating to schedule 2 (2 mod 5) and schedule 3 (2 mod 10) result in nonzero results (e.g., a remainder). Since schedule 1 is the only schedule that results in a zero result, schedule 1 can be selected for simulation time two. Each synchronous component of schedule 1 can be executed at clock cycle two.

At clock cycle 10, the mod calculations for each schedule result in a zero result. In that case, the schedule having the highest clocking rate can be selected. Schedule 3 has a clocking rate of 10, which exceeds the clocking rate of two for schedule 1 and the clocking rate of five for schedule 2. Accordingly, schedule 3 can be selected. Each of the synchronous components for schedule 3 can be executed at clock cycle 10.

Figure 4:
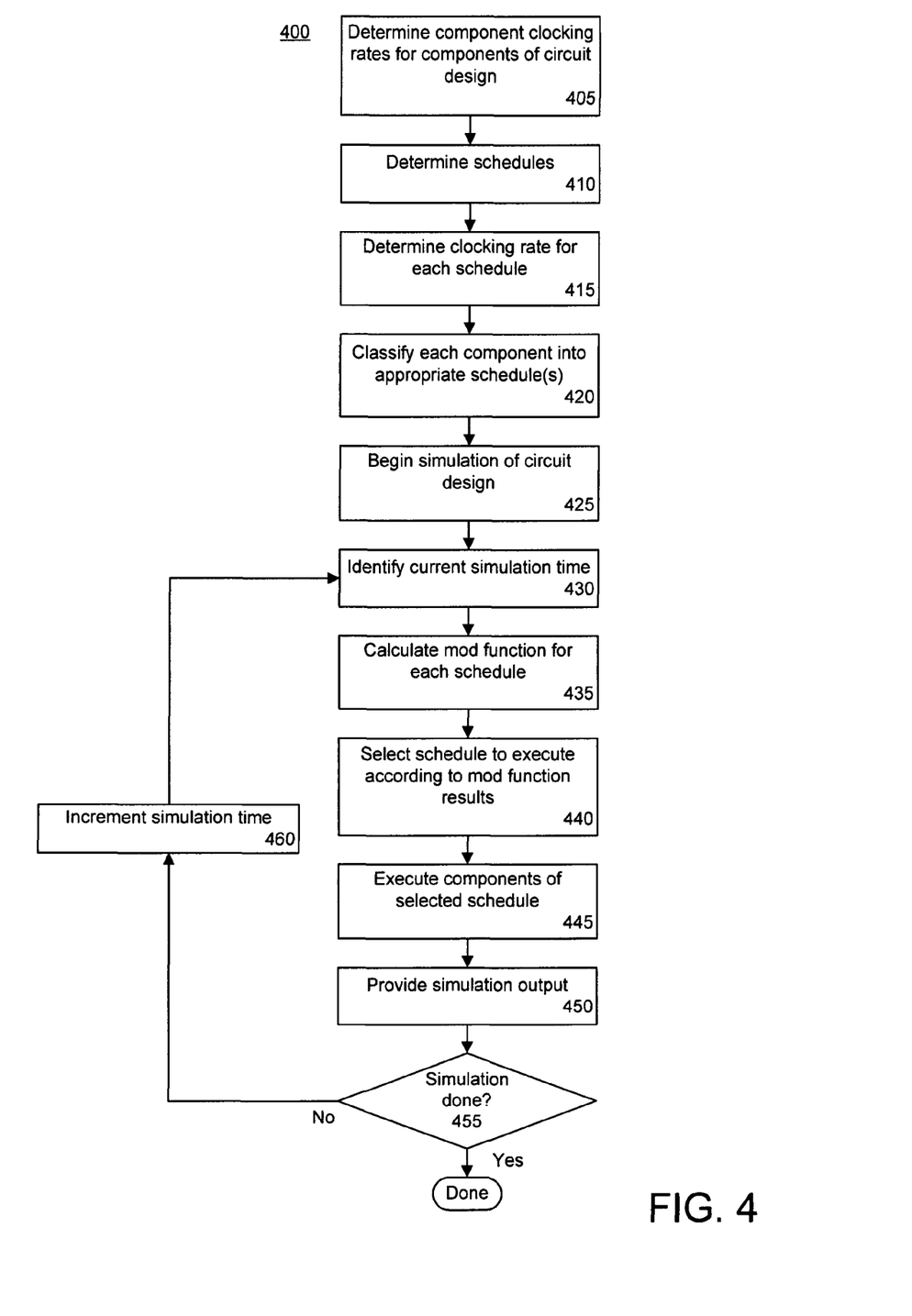
FIG. 4 is a flow chart illustrating a method of scheduling a circuit design for simulation in accordance with another embodiment of the present invention.

FIG. 4 is a flow chart illustrating a method 400 of scheduling a circuit design for simulation in accordance with another embodiment of the present invention. The method 400 can be implemented by an HLMS and, for example, a scheduling module of the HLMS. The method 400 can begin in a state where a programmatic description of a circuit design, as described herein, has been loaded into the HLMS. The method 400 further can begin prior to implementation of any simulation of the circuit design. Though a circuit design can be loaded into the HLMS, steps 405-420 can be implemented prior to any simulation of the circuit design, e.g., as pre-processing steps.

Accordingly, in step 405, the clocking rate of each synchronous component of the circuit design, referred to as the component clocking rate, can be determined. In step 410, schedules for the circuit design can be determined. As noted, if the circuit design has "n" different component clocking rates, a total of $2^n-1$ schedules can be determined, where each schedule is associated with a unique combination of one or more component clocking rates of the circuit design.

In illustration, if the circuit design has a primary schedule including component clocking rates of two, three, and five, then n will be equal to three. Accordingly, the primary schedule can be split into seven different schedules. These schedules correspond to the groupings of component clocking rates as follows: [2], [3], [5], [2,3], [2,5], [3,5], and [2,3,5]. Referring to the example of FIG. 3, three schedules would be determined corresponding to component clocking rates of [2], [5], and [2,5].

In step 415, the clocking rate for each schedule, referred to as the schedule clocking rate, can be determined. As noted, for schedules including only a single component clocking rate, the schedule clocking rate can be set equal to the component clocking rate. For example, where the schedule includes only synchronous components having a clocking rate of two, the schedule clocking rate can be set equal to two as well. For schedules including more than one component clocking rate, the schedule clocking rate can be computed as the lowest common multiple of the component clocking rates of that schedule. For example, if a schedule has components with component clocking rates of two, three, and five, the schedule clocking rate can be set equal to 30.

In step 420, each synchronous component can be assigned or classified into two or more different schedules. Each synchronous component can be assigned to each schedule having a constituent component clocking rate that corresponds to, or matches, the component being classified. Thus, for example, a synchronous component having a clocking rate of two will be assigned to each schedule that is to include components having a clocking rate of two. Taking the prior example where the primary schedule includes three component clocking rates of 2, 3, and 5, each synchronous component having a clocking rate of two will be assigned to the following schedules: [2], [2,3], [2,5], and [2,3,5].

In step 425, simulation of the circuit design can begin. In step 430, the current simulation time can be determined. As noted, the current simulation time can be specified as a number of clock cycles. Accordingly, the simulation time can begin at clock cycle one and be incremented by a single clock cycle (see step 460).

In step 435, for the current clock cycle, the modulus function can be calculated for each schedule. As noted, for each schedule, the following expression can be calculated: [(current simulation clock cycle) mod (schedule clocking rate)]. In step 440, a schedule can be selected according to the mod calculation result from each schedule. The scheduler can identify each schedule with a zero result, or remainder. Of those schedules, the schedule having the highest schedule clocking rate can be selected. In step 445, the synchronous components of that schedule can be executed.

In step 450, a simulation result can be output. As used herein, "outputting" or "output" can include, but is not limited to, writing to a file, writing to a user display or other output device, playing audible notifications, sending or transmitting to another system, exporting, or the like. For example, the resulting output and/or internal state of one or more or all of the synchronous components that have been executed for the selected schedule can be output. In another example, one or more indicators of circuit behavior, e.g., signal values and/or timing information relating to signal values generated by components, can be output.

In step 455, the HLMS can determine whether the simulation has completed or is to continue. If the simulation is not done, the method can continue to step 460 where the simulation time, e.g., the current simulation clock cycle, can be incremented. After step 460, the method can proceed to step 430 to identify the current simulation time. If the simulation has completed, the method can end.

In one embodiment, call stack flattening can be applied to more efficiently execute components of the circuit design during simulation. "Call stack flattening," in general, refers to the process of tracing a call stack of a computer program and locating a function pointer. In this case, the function pointer is for the simulation function of a given component. The call stack, e.g., the virtual function table, can be traversed to the underlying implementation for the simulation function of the component. This process typically entails following the call stack until the last terminal call is located, e.g., an irreducible point in the call stack.

Once the function pointer is located, the function pointer can be loaded into an array or other data structure. When that component is to be executed in the context of a simulation, the function of the component can be called directly via the function pointer from the array without having to traverse the entire implementation and object hierarchy of the circuit design and component. That is, the entire call stack does not need to be traversed, as is typically the case within the context of object oriented programs.

This process can be performed for one or more or all of the simulation functions for the components of the circuit design to be simulated. In consequence, a schedule of function pointers, organized into an array or other data structure, can be constructed. At simulation time, component functions can be called directly from the array or other data structure per the scheduling process(es) described herein.

Figure 5:
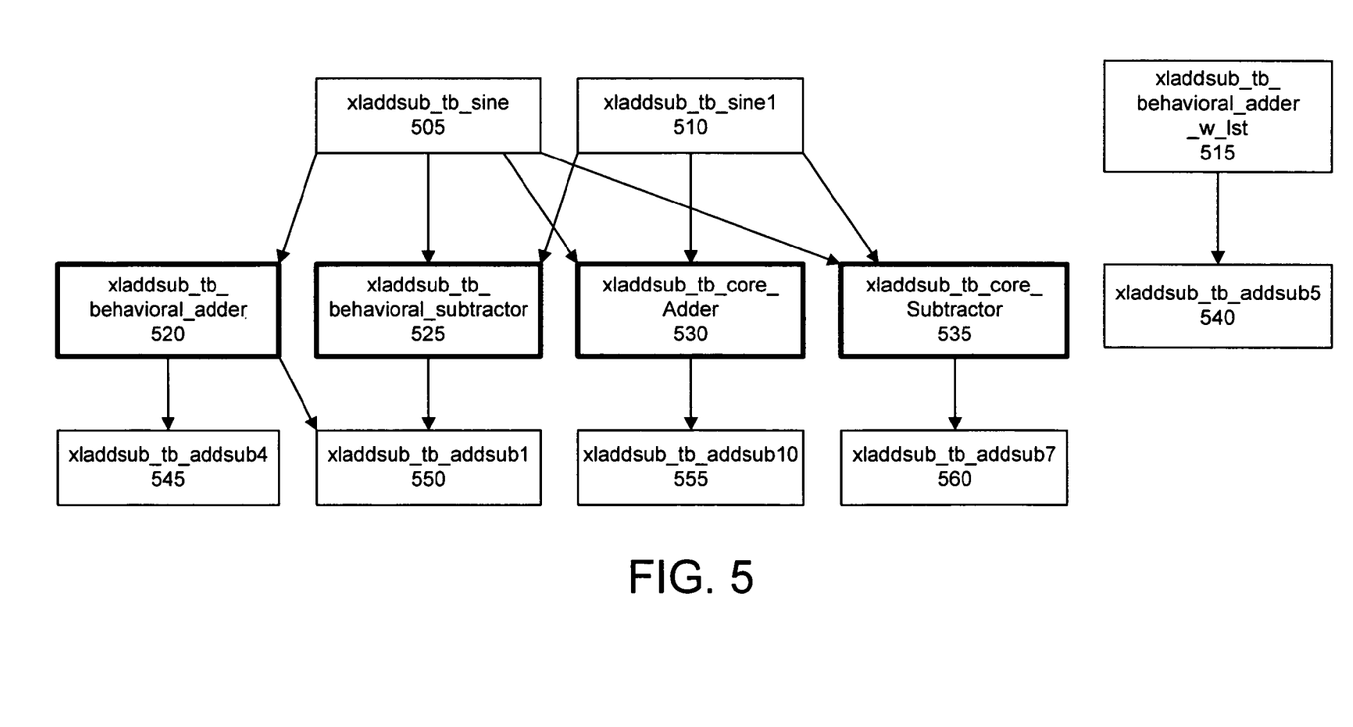
FIG. 5 is a diagram illustrating a plurality of sub-graphs of a directed graph for a circuit design in accordance with another embodiment of the present invention.

FIG. 5 is a diagram illustrating a plurality of sub-graphs of a directed graph for a circuit design in accordance with another embodiment of the present invention. FIG. 5 illustrates a technique for triggering execution of components of the circuit design during simulation. Each sub-graph represents a portion of the circuit design. For example, one sub-graph can include a component, e.g., node, 505 and include each child node depending from node 505, continuing to each terminal node, in this case nodes 545, 550, 555, and 560. Another sub-graph can correspond to node 510 and include each child node depending from node 510 extending to each terminal node, e.g., nodes 550, 555, and 560. Nodes 515 and 540 can be considered a third sub-graph.

For purposes of illustration, it can be assumed that nodes 505, 510, 515, 545, 550, 555, and 560 are synchronous nodes. Nodes 520, 525, 530, and 535 can represent combinatorial logic. In one embodiment, each sub-graph can have one or more branches that begin with a synchronous node, continue through combinatorial logic, and terminate at another synchronous node. Accordingly, a directed graph for a circuit design can include a large number of sub-graphs. From a review of the sub-graphs, it can be seen that node 520 provides an output signal to node 545 and node 550. Node 545 is dependent only upon the sub-graph of node 505. Node 550, however, in addition to receiving an input signal from node 520, also receives an input signal from node 525. Accordingly, node 550 is dependent upon two sub-graphs. In particular, node 550 is dependent upon the sub-graph of node 505 as well as the sub-graph of node 510.

In a conventional HLMS, the scheduler may execute a particular node, e.g., component, when less than all needed inputs are available. For example, a conventional scheduler may execute node 550 responsive to node 505 being executed or updated. Once updated, the output signal from node 505 can be assumed to be available to node 550, as node 520 is combinatorial logic. In some cases, little or no control exists within the scheduler of the HLMS to control the order in which a component executes. For example, though on a given clock cycle the particular elements to be executed may be identified, it is not always possible to determine the order in which components on the same clock cycle will execute with respect to one another.

In accordance with another embodiment of the present invention, triggers can be added to the directed graph which can facilitate control over the order of execution of nodes. With reference to FIG. 5, for example, a trigger can be added which indicates that node 550 is not to be executed until both input signals are available, e.g., both nodes 520 and 525 are updated within the simulation. In this manner, the simulation scheduling becomes "stateful" in that the particular input signals that must be updated before a given component is executed can be monitored and tracked.

If a trigger is not associated with node 550, node 550 may be executed once when node 520 is updated. Node 550 would need to be executed a second time when node 525 is updated. This would result in the execution of node 550 two times, effectively wasting computing resources and increasing the time needed for simulation. In view of the size of modern circuit designs and complexity of the sub-graphs, unnecessary executions of components can become burdensome and significantly increase the time needed for simulation. By adding triggers to the relevant sub-graphs, unnecessary execution of components can be avoided.

The flowchart in the figures illustrates the architecture, functionality, and operation of possible implementations of systems, methods and computer program products according to various embodiments of the present invention. In this regard, each block in the flowchart may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A computer-implemented method of scheduling a multi-rate, synchronous circuit design for simulation within a high-level modeling system, the method comprising:
   determining a component clocking rate for each of a plurality of synchronous components of the circuit design;
   classifying each of the plurality of synchronous components into a plurality of schedules according to the component clocking rate, wherein each schedule has a schedule clocking rate;
   for each clock cycle during the simulation:
      calculating, by a computer, a result of a modulus function of the clock cycle and the schedule clocking rate for each of the plurality of schedules;
      when at least one result is zero, selecting a schedule having a zero result and executing each synchronous component of the selected schedule; and
      when each result is non-zero, not selecting a schedule for the clock cycle; and
   when at least one result is zero, outputting a value determined through the executing of one of the synchronous components of the circuit design.

2. The computer-implemented method of claim 1, further comprising:
   for each schedule comprising a single clocking rate, setting the schedule clocking rate for the schedule to the single clocking rate; and
   for each schedule comprising more than one component clocking rate, setting the schedule clocking rate for the schedule to a least common multiple of each component clocking rate of the schedule.

3. The computer-implemented method of claim 1, wherein selecting a schedule further comprises, when a plurality of the schedules have a zero result from the modulus function, selecting the schedule having the largest schedule clocking rate.

4. The computer-implemented method of claim 1, wherein the classifying comprises:
  determining a number of different component clocking rates, denoted as "n," of the circuit design; and
  assigning each of the synchronous components into different ones of the plurality of schedules, wherein the plurality of schedules is equal to $2^n-1$.

5. The computer-implemented method of claim 1, wherein determining a component clocking rate and classifying each of the plurality of synchronous components occurs prior to a start of the simulation of the circuit design.

6. The computer-implemented method of claim 1, further comprising:
  locating a pointer to a simulation function for at least one of the synchronous components of the circuit design;
  storing the pointer in a data structure; and
  calling the simulation function via the pointer during the simulation to execute the at least one of the synchronous components.

7. The computer-implemented method of claim 1, further comprising:
  identifying a selected component of the plurality of synchronous components that receives input signals from a node of a first sub-graph and a node of a second sub-graph, wherein each node represents an asynchronous component; and
  executing the selected component responsive to the node of the first sub-graph and the node of the second sub-graph both being updated.

8. A computer-implemented method of scheduling a multi-rate, synchronous circuit design for simulation within a high-level modeling system, the method comprising:
  prior to simulation, determining a component clocking rate for each of a plurality of synchronous components of the circuit design;
  prior to simulation, classifying each of the plurality of synchronous components into a plurality of schedules according to the component clocking rate, wherein each schedule has a schedule clocking rate determined according to the component clocking rates of the schedule;
  for each clock cycle during the simulation:
    for each schedule, calculating by a computer a result of a modulus function of the clock cycle and the schedule clocking rate,
    when at least one result is zero, selecting a schedule having a zero result and executing each synchronous component of the selected schedule; and
    when each result is non-zero, not selecting a schedule for the clock cycle; and
  when at least one result is zero, outputting a value determined through the executing of one of the synchronous components of the circuit design.

9. The computer-implemented method of claim 8, further comprising:
  for each schedule comprising a single clocking rate, setting a schedule clocking rate of the schedule to the single clocking rate; and
  for each schedule comprising more than one component clocking rate, setting a schedule clocking rate for the schedule to a least common multiple of each component clocking rate of the schedule.

10. The computer-implemented method of claim 8, further comprising flattening a call stack for at least one update function for at least one of the synchronous components of the circuit design.

11. The computer-implemented method of claim 8, further comprising:
  identifying a selected component of the plurality of synchronous components that receives input signals from a node of a first sub-graph and a node of a second sub-graph, wherein each node represents an asynchronous component; and
  executing the selected component responsive to the node of the first sub-graph and the node of the second sub-graph both being updated.

12. A computer program product, comprising:
  a computer-usable medium having computer-usable program code that schedules a multi-rate, synchronous circuit design for simulation within a high-level modeling system, the computer-usable medium comprising:
    computer-usable program code that determines a component clocking rate for each of a plurality of synchronous components of the circuit design;
    computer-usable program code that classifies each of the plurality of synchronous components into a plurality of schedules according to the component clocking rate, wherein each schedule has a schedule clocking rate;
    computer-usable program code that, for each clock cycle during the simulation,
      calculates a result of a modulus function of the clock cycle and the schedule clocking rate for each of the plurality of schedules;
      when at least one result is zero, selects a schedule having a zero result and executes each synchronous component of the selected schedule; and
      when each result is non-zero, does not select a schedule for the clock cycle; and
    computer-usable program code that, when at least one result is zero, outputs a value determined through the execution of one of the synchronous components of the circuit design.

13. The computer-program product of claim 12, wherein the computer-usable medium further comprises:
  computer-usable program code that, for each schedule comprising a single clocking rate, sets a schedule clocking rate for the schedule to the single clocking rate; and
  computer-usable program code that, for each schedule comprising more than one component clocking rate, sets a schedule clocking rate for the schedule to a least common multiple of each component clocking rate of the schedule.

14. The computer-program product of claim 12, wherein the computer-usable program code that selects further comprises computer-usable program code that, when a plurality of the schedules have a zero result from the modulus function, selects the schedule having the largest scheduling clocking rate.

15. The computer-program product of claim 12, wherein the computer-usable program code that classifies comprises:
  computer-usable program code that determines a number of different component clocking rates, denoted as "n," of the circuit design; and
  computer-usable program code that assigns each of the synchronous components into different ones of the plurality of schedules, wherein the plurality of schedules is equal to $2^n-1$.

16. The computer-program product of claim 12, wherein the computer-usable medium further comprises:

computer-usable program code that locates a pointer to a simulation function for at least one of the synchronous components of the circuit design;

computer-usable program code that stores the pointer in a data structure; and computer-usable program code that calls the simulation function via the pointer during the simulation to execute the at least one of the synchronous components.

17. The computer-program product of claim 12, wherein the computer-usable medium further comprises:

computer-usable program code that identifies a selected component of the plurality of synchronous components that receives input signals from a node of a first sub-graph and a node of a second sub-graph, wherein each node represents an asynchronous component; and computer-usable program code that executes the selected component responsive to the node of the first sub-graph and the node of the second sub-graph both being updated.

18. The computer-implemented method of claim 1, further comprising:

for each schedule comprising a single clocking rate, setting a schedule clocking rate for the schedule to the single clocking rate.

19. The computer-implemented method of claim 1, further comprising:

for each schedule comprising more than one component clocking rate, setting a schedule clocking rate for the schedule to a least common multiple of each component clocking rate of the schedule.

20. The computer-program product of claim 12, wherein the computer-usable medium further comprises at least one of:

computer-usable program code that, for each schedule comprising a single clocking rate, sets a schedule clocking rate for the schedule to the single clocking rate; or computer-usable program code that, for each schedule comprising more than one component clocking rate, sets a schedule clocking rate for the schedule to a least common multiple of each component clocking rate of the schedule.

* * * * *